(12) United States Patent
Parkinson (10) Patent No.: US 8,183,565 B2
(45) Date of Patent: May 22, 2012

(54) PROGRAMMABLE RESISTANCE MEMORY ARRAY WITH DEDICATED TEST CELL

(75) Inventor: Ward Parkinson, Boise, ID (US)

(73) Assignee: Ovonyx, Inc., Sterling Heights, MI (US)

( * ) Notice: Subject to any disclaimer, the term of this patent is extended or adjusted under 35 U.S.C. 154(b) by 32 days.

(21) Appl. No.: 12/383,489

(22) Filed: Mar. 25, 2009

(65) Prior Publication Data

US 2010/0244023 A1    Sep. 30, 2010

(51) Int. Cl.
*H01L 23/58* (2006.01)
(52) U.S. Cl. .......... 257/48; 257/435; 257/E31.121; 438/18; 382/145

(58) Field of Classification Search .......... 257/2–4, 257/48, 435, E31.121; 438/18; 382/145; 324/158
See application file for complete search history.

(56) References Cited

U.S. PATENT DOCUMENTS

2003/0123277 A1* 7/2003 Lowrey et al. ............... 365/148
2009/0257265 A1* 10/2009 Chen et al. ................... 365/148
* cited by examiner

*Primary Examiner* — Jami M Valentine
(74) *Attorney, Agent, or Firm* — Kevin L. Bray (57) ABSTRACT

A rewritable nonvolatile memory includes a test cell that is dedicated to testing the storage characteristics of other, similar, storage cells formed within the same integrated circuit memory. The test cell may be share the same structure and composition as storage cells and may be positioned proximate storage cells.

21 Claims, 6 Drawing Sheets

PROGRAMMABLE RESISTANCE MEMORY ARRAY WITH DEDICATED TEST CELL

FIELD OF INVENTION

This invention relates to electronic memory devices.

BACKGROUND OF THE INVENTION

As electronic memories approach limits beyond which they will no longer be able to produce the density/cost/performance improvements so famously set forth in Moore's law, a host of memory technologies are being investigated as potential replacements for conventional silicon complementary metal oxide semiconductor (CMOS) integrated circuit memories. Among the technologies being investigated are programmable resistance technologies, such as phase change memory technologies. Phase-change memory arrays are based upon memory elements that switch among two material phases, or gradations thereof, to exhibit corresponding distinct electrical characteristics. Alloys of elements of group VI of the periodic table, such as Te, S or Se, referred to as chalcogenides or chalcogenic materials, can be used advantageously in phase change memory cells. In some chalcogenide materials, the resistivity varies by two or more orders of magnitude when the material passes from the amorphous (more resistive) phase to the crystalline (more conductive) phase, and vice versa. Further, the resistivity of the chalcogenide materials generally depend on the temperature with the amorphous state generally being more temperature dependent than the crystalline state.

A chalcogenide memory device may utilize the wide range of resistance values available for the material as the basis of memory operation. Each resistance value corresponds to a distinct structural state of the chalcogenide material and one or more of the states can be selected and used to define operational memory states. Chalcogenide materials exhibit a crystalline state, or phase, as well as an amorphous state, or phase. Different structural states of a chalcogenide material differ with respect to the relative proportions of crystalline and amorphous phase in a given volume or region of chalcogenide material. A chalcogenide memory device's range of resistance values is generally bounded by a set state and a reset state of the chalcogenide material. By convention, the set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Phase change may be induced by increasing the temperature locally. Below 150° C., both of the phases are stable. Above 200° C., there is a nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C. for GST 225, for example) and then cool it off rapidly, i.e. quench. From the electrical standpoint, it is possible to reach the crystallization and melting temperatures by causing a current to flow through a crystalline resistive element that heats the chalcogenic material by the Joule effect.

Each memory state of a chalcogenide memory material corresponds to a distinct range of resistance values and each memory resistance value range signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material, it is possible to control the relative proportions of crystalline and amorphous phase regions within a volume of the material and to thereby control the structural (and corresponding memory) state of the chalcogenide material to store (resistance) information.

Each memory state can be programmed by providing the current pulse characteristics of the state and each state can be identified, or "read", in a non-destructive fashion by measuring the resistance of the material. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774,387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron Devices, vol. 51, p. 714-719 (2004) by Pirovano et al.; and "Morphing Memory," published in *Science News*, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of chalcogenide materials. The references also describe the structural transformations from the crystalline state to the amorphous state (and vice versa) via a series of partially crystalline states in which the relative proportions of crystalline and amorphous regions vary during the operation of electrical and optical programming of chalcogenide materials.

A wide range of chalcogenide compositions has been investigated in an effort to optimize the performance characteristics of chalcogenide devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or cross-linking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may be deposited with a reactive sputtering process with gases such as $N_2$ or $O_2$: forming a chalcogenide nitride, or oxide, for example and chalcogenide may be modified by an ion implantation or other process. Materials may also be deposited using chemical vapor deposition (CVD) processes, for example.

Early work in chalcogenide devices demonstrated electrical switching behavior in which switching from an "off" resistive state to an "on" conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at fast switching speeds. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures," Physical Review Letters, vol. 21, p. 1450-1453 (1969) by S. R. Ovshinsky; "Amorphous Semiconductors for Switching, Memory, and Imaging Applications," IEEE Transactions on Electron Devices, vol. ED-20, p. 91-105 (1973) by S. R. Ovshinsky and H. Fritzsche; the disclosures of which are hereby incorporated by reference. Three-terminal OTS devices are disclosed, for example, in U.S. Pat. Nos. 6,969,867 and 6,967,344; the disclosures of which are hereby incorporated by reference.

Rewritable nonvolatile integrated circuit memories are subject to endurance limits: the inability to reliably store and retrieve data more than a limited number of times. And similarly, data retention is adversely affected. Some types of memory suffer more than others. Conventional "flash" memory, for example may be limited to only $10^4$ to $10^5$ write cycles. A number of techniques may be employed to extend the endurance and/or data retention period or upper allowed temperature of a rewritable nonvolatile memory system. Wear-leveling, which involves spreading the number of accesses throughout a memory, ensures that no one segment of a memory reaches its endurance limit before other segments have. "Extra-sizing," the memory: employing more memory than would nominally be required to handle the volume of information stored therein, may be used in conjunction with wear-leveling to extend the endurance of the system; twice the memory could, for example, double the endurance of a nonvolatile memory system.

Although endurance limits aren't generally a significant consideration when using rewritable nonvolatile memory for program storage (code would rarely, if ever, be updated more than $10^5$ times, for example) endurance limits must be accommodated in many systems that use rewritable nonvolatile memory to store data. Short cycle-life products, products that are intended for only a short period of use, such as disposable consumer electronics, may not be limited by the endurance of rewriteable nonvolatile memory; the device may be discarded long before the rewritable nonvolatile memory it contains is accessed enough to approach its endurance limit. However, in many applications the endurance of rewritable nonvolatile memories must be known and accounted for when such memories are employed to store data in medium to long cycle-life devices.

Given the importance of endurance, endurance testing is a critical aspect of rewritable nonvolatile integrated circuit memory production. However, as the name implies, endurance testing can be time-consuming and, therefore, costly. A method and apparatus that provide for faster and more efficient endurance testing of rewritable nonvolatile integrated circuit memories, including phase change memories, would therefore be desirable.

SUMMARY OF THE INVENTION

A reprogrammable nonvolatile memory in accordance with the principles of the present invention includes test structures that enable accelerated testing of the memory, thereby providing for economical testing of such memory devices. Such accelerated testing may be used during manufacturing, for example. In illustrative embodiments, test structures may also be employed to determine characteristics such as $R_{virgin}$, storage-state current levels, such as $I_{RESET}$, or SET speed, for example. Although test structures and methods in accordance with the principles of the present invention may be employed by a wide variety of rewritable nonvolatile memories, for ease and clarity of exposition, programmable resistance memories and, more particularly, phase change memories, will be used as illustrative embodiments herein. The use of such illustrative embodiments is not meant to restrict the scope of the invention.

In an illustrative embodiment a rewritable nonvolatile memory includes cells arranged in an array that are used to store and retrieve information such as data and program code. Such cells will be referred to herein as storage cells. Additionally, a rewritable nonvolatile integrated circuit memory in accordance with the principles of the present invention includes one or more rewritable nonvolatile memory cells that are dedicated to testing. The test-dedicated cells, also referred to as "test cells" herein, are configured to provide performance information that can be extrapolated to the performance of the storage cells collocated on the integrated circuit memory. In an illustrative embodiment test cells closely duplicate the structure and composition of the storage cells, thereby enabling a relatively straightforward extrapolation of performance data from a test cell to storage cells.

In accordance with the principles of the present invention, test cells may be strategically distributed relatively close to storage cells to ensure that area-specific cell differences such as may arise during the manufacturing process may be accounted for in a testing process. In illustrative embodiments test cells are distributed along orthogonal sides, among storage cell blocks, or around the entire perimeter of a storage cell array in order to ensure that area-specific anomalies, if present, are uncovered during testing, such as accelerated stress testing.

Accelerated stress testing may be implemented, in a phase change memory, for example, by passing a current greater than the nominal RESET current ($I_{RESET}$) through one or more test cells. Alternatively, the duty cycle of a test current may be extended to as much as 100% in order to accelerate a stress-to-failure process. In such an embodiment the time required to stress a device to failure may be correlated to the number of cycles such a device might be expected to endure under nominal operating conditions (that is, prescribed amplitude and duty cycle). Steady-state application of IRESET for a period of 2 seconds might correspond to an endurance figure of $10^8$ cycles, for example. Data for such a correlation may be gathered for a variety of cell structures and compositions before manufacturing tests begin and stored in test equipment that interacts with test cells on a memory under test, for example. Combinations of higher-level currents and extended duty-cycle are also contemplated within the scope of the present invention.

A memory in accordance with the principles of the present invention may employ off-chip resources to assist in accurately writing to and reading from test cells included within a rewritable nonvolatile integrated circuit memory. In an illustrative embodiment a memory in accordance with the principles of the present invention includes an interface that supplies memory-array signals off-chip for analysis. Such signals may be row or column signals that could be used by a separate integrated circuit to determine the contents of an accessed memory cell, for example. In such an embodiment, the signals may be conditioned, by buffering for example, before being sent off-chip. Such row and column signals may be taken directly from row and column lines within a memory array and, as such, would provide direct access to a selected memory cell for evaluation of such cell's content.

A memory in accordance with the principles of the present invention may also include an interface for accepting access signals from off-chip. Such access signals may be current-pulse or voltage-pulse signals employed by a phase change memory, for example and may include READ signals or WRITE signals. READ signals may be used in conjunction with a variety of READ methods and may be employed to determine the contents of memory cells programmed using either binary or multilevel cell methods. Similarly, the WRITE signals may exhibit a variety of characteristics and may be of different amplitudes, durations, and rates of increasing or decreasing amplitude, and may be employed to write binary or multi-level (that is, three or more-level) data into cells, particularly test cells, within the memory array.

A rewritable nonvolatile integrated circuit memory that includes a test memory cell in accordance with the principles of the present invention may be particularly suitable for operation in a variety of electronic devices, including cellular telephones, radio frequency identification devices (RFID), computers (portable and otherwise), solid state drives (SSDs), location devices (e.g., global positioning system (GPS) devices, particularly those that store and update location-specific information), and handheld electronic devices, including personal digital assistants (PDAs), and entertainment devices, such as MP3 players, for example.

DETAILED DESCRIPTION

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, chemical, and electrical changes may be made without departing from the spirit or scope of the invention. Polarities and types of devices and supplies may be substituted in a manner that would be apparent to one of reasonable skill in the art. Process descriptions may include flowcharts that illustrate various steps taken in a process. Such flowcharts and accompanying discussion are not meant to be an exhaustive explanation of every step and every procedure in such a process. Rather, they are meant to provide a description with sufficient detail to enable one of ordinary skill in the art to practice and use the invention.

In some embodiments, additional steps may be employed or steps may be carried out in a different sequence than set forth in the flowchart and associated discussion. The term "voltage signal" or "voltage pulse signal" is used herein to refer to a signal that is voltage-compliant. That is, the voltage of the signal is regulated to a desired level or profile, regardless of the load presented to the signal source. Similarly, the term "current signal" or "current pulse signal" is used herein to refer to a signal that is current-compliant; the current of the signal is regulated to a desired level or profile, regardless of the load presented to the signal source. Although illustrative embodiments employ phase change memories, test structures and methods in accordance with the principles of the present invention may be employed by a variety of rewritable nonvolatile memories, including FLASH memories and resistive random access memories (RRAM), for example. Accordingly, the scope of the invention is defined only by reference to the appended claims.

Figure 1:
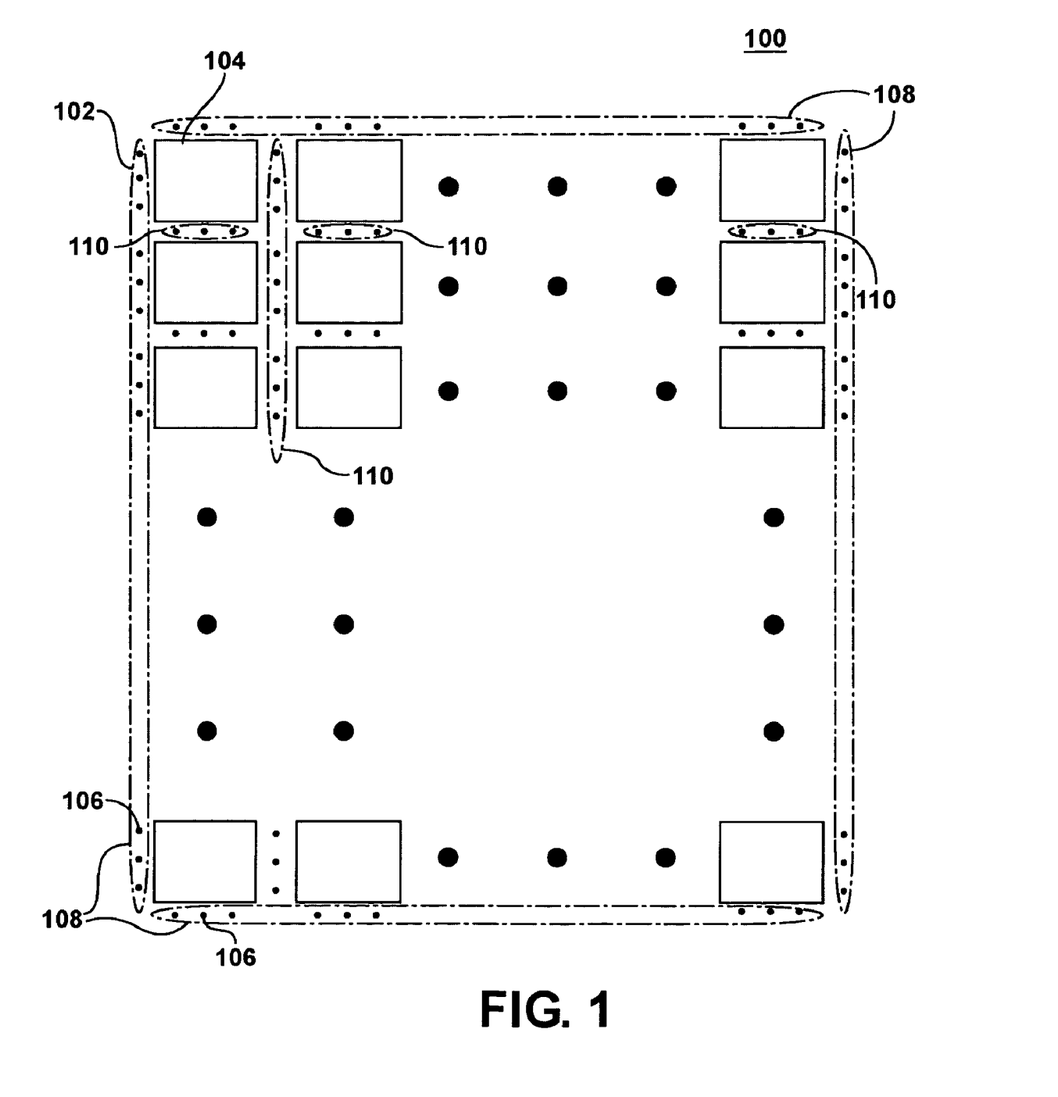
FIG. 1 is a block diagram of an array of rewritable nonvolatile memory cells in accordance with the principles of the present invention that illustrates, conceptually, the relative placement of storage and test cells.

In the illustrative embodiment of FIG. 1, a reprogrammable nonvolatile memory 100 in accordance with the principles of the present invention includes at least one test cell 102 which is dedicated to testing, not to end-user storage functions. Because the test cell is not used for end-user storage accelerated testing, including destructive testing, may be performed on the memory cell 102. In accordance with the principles of the present invention, results from such tests may be extrapolated to storage cells 104 within the memory 100. The memory 100 includes blocks (also referred to herein as tiles), of storage cells 104 that perform the ordinary storage functions of the memory 100 and which are described in greater detail in the discussion related to the following Figures.

Testing, including accelerated testing, afforded by test cell 102 provides for relatively fast and economical testing of the memory 100 during the manufacturing process. Test results may be transmitted to external devices, such as automated test equipment, and/or stored within the memory 100. When stored within the memory 100, the test results may be located within storage cells positioned within the blocks 104 or within separate storage cells dedicated to testing, for example. The test cells 102 are configured to provide performance information that can be extrapolated to the performance of the storage cells collocated on the memory integrated circuit. To that end, the test cells 102 may closely duplicate the structure and composition of the storage cells 104, thereby enabling a relatively straightforward extrapolation of performance data from a test cell 102 to storage cells 104. Other configurations, such as those that may further accelerate a test process, are contemplated within the scope of the invention. One or more test cells 102 may be used in conjunction with a built-in-self-test, for example.

Test results stored within a memory 100 may be used by a programmer/developer to tailor operation of the device in a manner that is analogous to "over-clocking" a device. That is, although a memory 100 may be specified to operate to a certain minimal level, individual integrated circuits may exceed this specified value and that additional performance, although not guaranteed, may be captured by a user willing to operate "outside spec." A memory's endurance value may be specified as $10^8$ cycles, for example, but endurance testing may indicate that an individual device may operate for $10^9$ cycles. A programmer may choose to take advantage of the additional order-of-magnitude of longevity provided by such a device in an application that can withstand failures and/or within a system that provides for "graceful failure" (that is, a controlled denouement), for example.

In illustrative embodiments, test cells 102 may also be employed to determine characteristics such as $R_{virgin}$, storage-state current levels, such as $I_{RESET}$, or SET speed, for example. Rvirgin, the initial resistance exhibited by a cell, may provide an indication of whether storage material, which may be a chalcogenide material, has been properly formed, making good contact with cell electrodes during the manufacturing process, for example. A high Rvirgin could indicate that there is inadequate contact or unintended material from processing or use between the cells' electrodes and memory material. Such a test could be used, for example, as an initial threshold test to rapidly determine whether the memory 100 is sufficiently functional. Programming current levels may be determined, for example, by applying programming pulses, reading the results, and iteratively increasing current levels until the test cell 102 exhibits a RESET level of resistance. Similarly, SET speed may be measured by applying programming pulses of increasing length to a test cell, measuring the resultant resistance, and iteratively RESETing the cell and increasing the duration of the applied programming pulse until the cell is SET.

In accordance with the principles of the present invention, a plurality of test cells 102 may be arranged proximate the storage-cell blocks 104 along orthogonal sides of a storage cell array (group 106), surrounding the entire storage cell array (group 108), or distributed throughout the storage cell array (group 110), for example. Area-specific cell differences such as may arise during the manufacturing process may be detected in a testing process by arranging test cells in close proximity to storage cells.

Accelerated stress testing may be implemented, in a phase change memory, for example, by passing a current greater than the nominal RESET current ($I_{RESET}$) through one or more test cells such as test cell 102. Alternatively, the duty cycle of a test current may be extended to as much as 100% in order to accelerate a stress-to-failure process. In such an embodiment the time required to stress a device to failure may be correlated to the number of cycles such a device might be expected to operate. Steady, or DC, application of $I_{RESET}$ for a period of 2 seconds might correspond to an endurance figure of $10^8$ cycles, for example. Such data may also correlate to the data retention of the memory on this chip. Data for such a correlation may be gathered for a variety of cell structures and compositions before manufacturing tests begin and stored in test equipment that interacts a test cell 102 on a memory under test, for example. Combinations of higher-level currents and extended duty-cycle may also be employed in a phase change memory embodiment in accordance with the principles of the present invention.

Because stress-testing devices to failure could result in short-circuiting a memory element, test cells and their associated access circuitry may be configured in a way that prevents shorting of row and column lines that are associated with other cells and, in particular, with storage cells. As will be described in greater detail in the discussion related to FIG. 2, each test cell may include an isolation device, such as an OTS, which, among other functions, prevents the shorting of row and column lines that might otherwise occur when a test cell is stressed to failure.

Figure 2:
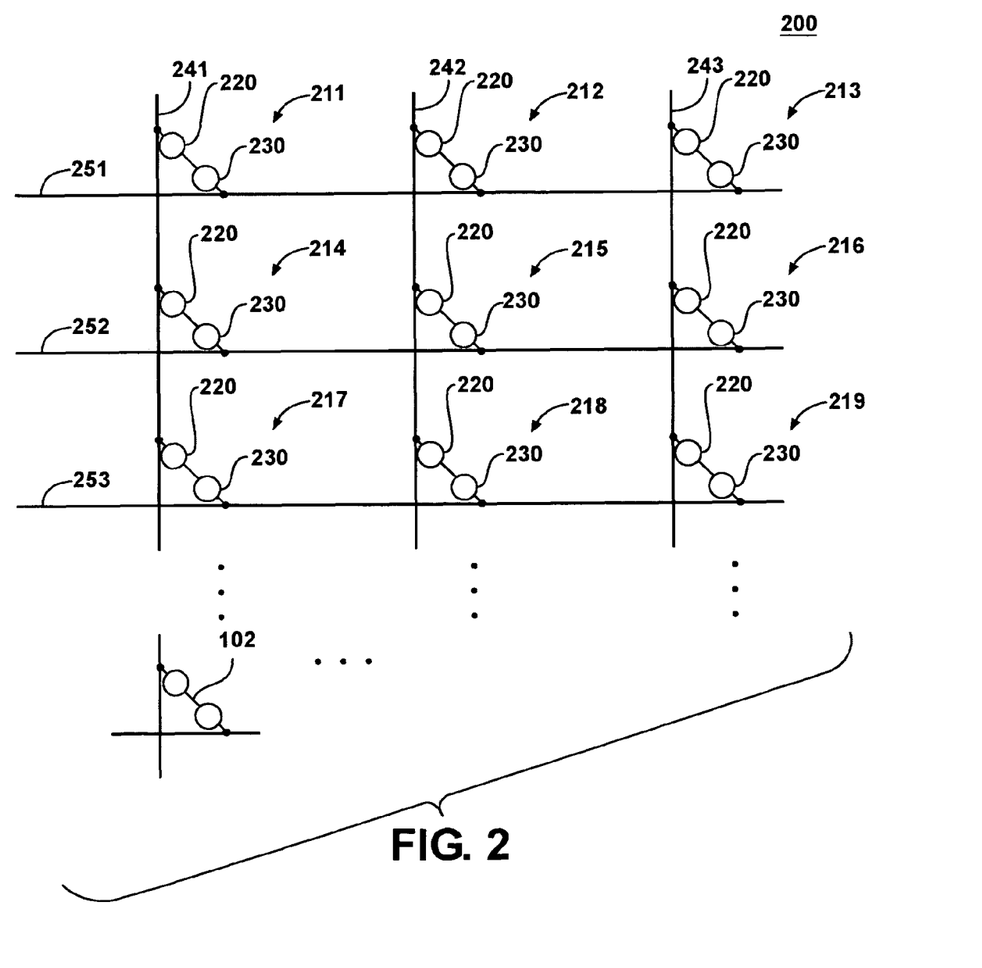
FIG. 2 is a block diagram of an array of rewritable nonvolatile memories, each cell of which, including the one or more test cells, includes an isolation device and a programmable resistance memory element, in accordance with the principles of the present invention.

In the illustrative embodiment of FIG. 2, a memory array 200 in accordance with the principles of the present invention includes memory cells 211-219 arranged in a cross-point array. Each cell includes a memory element 230 and an isolation device 220. For convenience and clarity of illustration, only nine cells are shown, but billions may be included in an individual device. The isolation device 220 may be implemented as a transistor, diode, or as an Ovonic Threshold Switch (OTS), for example. The cells 211-219 may be configured as test cells or as storage cells, as described in the discussion related to FIG. 1.

The memory array 200 includes column lines 241-243 and row lines 251-253, which are used to select a particular memory cell within the array during an access operation. An access operation may be a READ operation, or a WRITE operation, for example. In a binary memory configuration, each cell may be written to a "1" or a "0." In a multi-level configuration, each cell may be written to any of three or more memory states. Row lines 251-253 and column lines 241-243 may also be referred to herein, respectively, as word address and column address lines.

With memory elements 230 connected to word address lines and coupled through isolation devices 220 to bit address lines 241-243, a specific memory cell is accessed by assertion of the appropriate word and bit address lines. Asserting word address line 252 and bit address line 242, for example, selects memory cell 215 for access (that is, for a READ or WRITE operation).

In operation, the isolation device 220 may act as a switch that is either "off" or "on" depending on the voltage applied across the memory cell 211-219. The off state may be a substantially electrically nonconductive state and the on state may be a substantially electrically conductive state. The isolation device 220 may exhibit a threshold voltage beyond which the device becomes highly electrically conductive. With an applied potential less than the threshold voltage, the device is, effectively an open circuit, which thereby isolates the associated memory element 230. Such isolation is used to ensure that inadvertent accesses are not executed upon or through memory elements that are programmed to a low-resistance state and that are "partially-accessed." By "partially-accessed," we mean a memory element that shares either a row or column access line (but not both) with a memory element that is being accessed.

With an applied voltage greater than the threshold voltage, the device 220 is, effectively, a short circuit to its holding voltage Vh, which thereby allows access to the associated memory element 230. With the isolation device 220 "thresholded," a portion of the voltage applied across the memory cell 215 will fall across the isolation device 220. The remainder of the applied voltage will fall across the memory element 230 and, when properly biased, that portion of the applied voltage will be sufficient to perform an access operation (for example, READ or WRITE). The isolation device 220 may also be referred to as an access device, a select device, or a switch, for example. For a cell 211-219 configured as a test cell, an isolation device 220 may also ensure that row and column lines are not shorted, should an associated memory element 230 be shorted during the course of an endurance test or retention test, for example.

Figure 3:
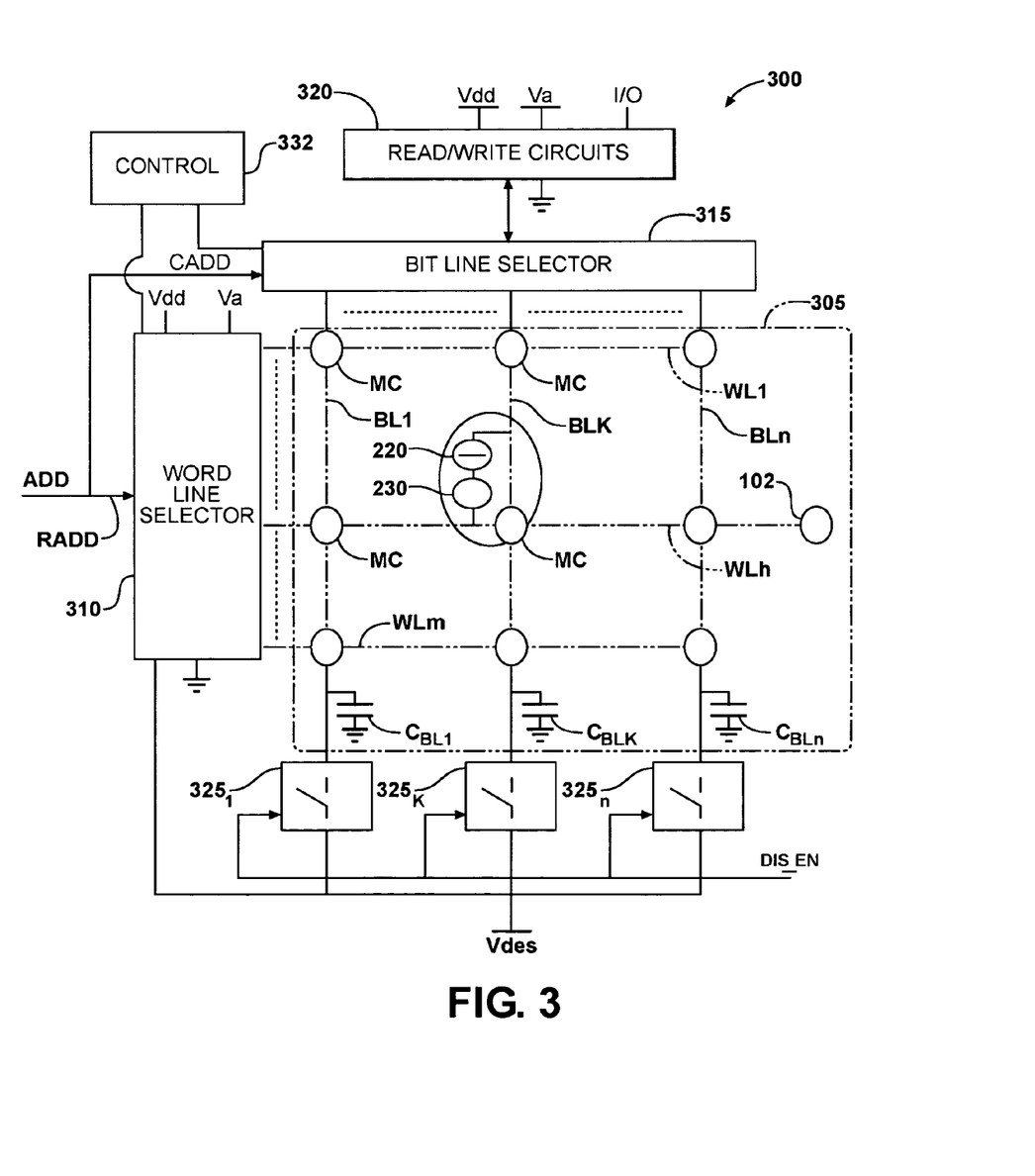
FIG. 3 is a block diagram of a memory array, including peripheral circuitry, in accordance with the principles of the present invention.

The block diagram of FIG. 3 illustrates a crosspoint array of memory cells such as those of FIG. 2, along with associated access circuitry. In this illustrative embodiment, the memory cells are labeled MC, the row/word lines are labeled WLn, and the column/bit lines are labeled Bln. As previously noted, the terms, "rows," "word lines," "bit lines," and "columns" are merely meant to be illustrative and are not limiting with respect to the type and style of the sensed array. The memory 300 includes a plurality of memory cells MC arranged in an array 305. The memory cells MC in the matrix 305 may be arranged in m rows and n columns with a word line WL1-WLm associated with each matrix row, and a bit line BL1-BLn associated with each matrix column.

The memory 300 may also include a number of auxiliary lines, including a supply voltage line Vdd and a ground (also referred to as reference) voltage line, respectively distributing a supply voltage Vdd and return throughout the memory 300. Depending on configurations and materials, the supply voltage Vdd may be, for example, in a range from 1V to 3V: 1.8V, for example. A high voltage supply line Va may provide a relatively high voltage, generated by devices (for example, charge-pump voltage boosters not shown in the drawing) integrated on the same chip (that is, included on the same standalone device), or externally supplied to the memory device 300. For example, the high voltage Va may be 4.5-5 V and such a voltage may be employed, for example to provide a relatively high current to a selected memory cell.

Each memory cell MC in FIG. 3 includes a memory element 330 that employs a programmable resistance memory material, such as phase change memory material, and an isolation device 320, as described in the discussion related to FIG. 2. Each memory cell MC in the matrix 305 is connected to a respective one of the word lines WL1-WLm and a respective one of the bit lines BL1-BLn. In particular, the storage element 330 may have a first terminal connected to the respective word line WL1-WLn and a second terminal connected to a first terminal of the associated access device 320. The access device 320 may have a second terminal connected to a bit line BL1-BLm. Alternatively, the storage element 330 may be connected to the respective bit line BL1-BLm and the access device 320, associated with the storage element 330, may be connected to the respective word line WL1-WLn.

A memory cell MC within the matrix 305 is accessed by selecting the corresponding row and column pair, i.e. by selecting the corresponding word line and bit line pair. Word line selector circuits 310 and bit line selector circuits 315 may perform the selection of the word lines and of the bit lines on the basis of a row address binary code RADD and a column address binary code CADD, respectively, part of a memory address binary code ADD, for example received by the memory device 300 from a device external to the memory (for example, a microprocessor). The word line selector circuits 310 may decode the row address code RADD and select a corresponding one of the word lines WL1-WLm, identified by the specific row address code RADD received. The bit line selector circuits 315 may decode the column address code CADD and select a corresponding bit line or, more generally, a corresponding set of bit lines of the bit lines BL1-BLn. The set may correspond, for example, to selected bit lines that can be read during a burst reading operation on the memory device 300. A bit line BL1-BLn may be identified by the received specific column address code CADD.

The bit line selector circuits 315 interface with read/write circuits 320. The read/write circuits 320 enable the writing of desired logic values into the selected memory cells MC, and reading of the logic values currently stored therein. The read/write circuits 320 may include sense amplifiers, comparators, reference current/voltage generators, and current and/or voltage pulse generators for reading the logic values stored in the memory cells MC and current and/or voltage pulse generators for writing to the memory cells MC. As will be described in greater detail in the discussion related to FIG. 5, the read/write circuit 320 may include test interface circuitry that provides test signals for access to test cells 102. Such test interface circuitry may include circuitry that permits test signals, particularly higher-amplitude current signals, from "off-chip" (that is, received from another electronic device) to be directly applied to test cells or which permits test cells to be directly read from circuitry located off-chip, for example.

In an illustrative embodiment, when the memory device 300 is not being accessed (between reads and writes or during a standby period, for example), the word line selection circuits 310 may keep the word lines WL1-WLm at a relatively high de-selection voltage, Vdes (for example, a voltage roughly equal to half the high voltage Va (Va/2)). At the same time, the bit line selection circuits 315 may keep the bit lines BL1-BLn disconnected, and thus isolated, from the read/write circuits 320 or, alternatively, at the de-selection voltage Vdes. In this way, inadvertent accesses of the memory cells is prevented, since the bit lines BL1-BLn are floating or at a voltage close to that of the deselected word lines and, consequently, approximately zero voltage is dropped across the access elements 120. Additionally, spare (redundant) rows and columns may be provided and used with a selection means to replace defective rows, bits, and columns by techniques familiar to those skilled in the art. Unused dummy rows and columns may be provided at the edge arrays, including next to the test bits, to assure against photo variation during the photo transition from the array to peripheral circuits, as will be known by those reasonably skilled in the art.

Access methods such as may be employed by a rewriteable nonvolatile memory, including a programmable resistance memory, in accordance with the principles of the present invention are described in greater detail in the discussion related to the following Figures. Such access methods may be used to access test- or storage-cells and may be used in combination with other, known, access methods disclosed, for example, in: U.S. Pat. No. 7,154,774 to Bedeschi et al, U.S. Pat. No. 7,280,390, to Kostylev et al, published U.S. patent application 2006/0056251 to Parkinson, published U.S. patent application 2006/0227590 to Parkinson, published U.S. patent application 2006/0279979 to Lowrey et al, and published U.S. patent application 2006/0227592 to Parkinson et al, which are hereby incorporated by reference.

During an access operation, the word line selection circuits 310 may lower the voltage of the selected one of the word lines WL1-WLm to a word line selection voltage $V_{WL}$ (for example, having a value equal to 0V, ground potential, and the remaining word lines may be kept at the word line de-selection voltage Vdes. Similarly, the bit line selection circuits 315 may couple a selected one of the bit lines BL1-BLn (more typically, a selected bit line set) to the read/write circuits 320, while the remaining, non-selected bit lines may be left floating or held at the de-selection voltage, Vdes. When the memory device 300 is accessed, the read/write circuits 320 force a suitable current and/or voltage pulse into each selected bit line BL1-BLn. The pulse amplitude, duration, and waveshape, including trailing edge rate, may depend, for example, on the operation to be performed and will be described in greater detail in the discussion related to the following Figures.

In order to avoid spurious reading of the memory cells MC, the bit line stray capacitances $C_{BL1}$-$C_{BLn}$ may be discharged before performing a read operation. To that end, bit line discharge circuits $325_{1-n}$ may be enabled in a bit line discharge phase of the memory device operation that may take place before or after an access operation, for example. The bit line discharge circuits $325_{1-n}$ may employ N-channel MOSFETs, for example, each having a drain terminal connected to the corresponding bit line BL1-BLn, a source terminal connected to a de-selection voltage supply line Vdes providing the de-selection voltage Vdes and a gate terminal controlled by a discharge enable signal DIS_EN.

In an illustrative embodiment, before starting an access operation, the discharge enable signal DIS_EN may be temporarily asserted to a sufficiently high positive voltage, so that all the discharge circuits $325_{1-n}$ turn on and connect the bit lines BL1-BLn to the de-selection voltage supply line Vdes. The discharge currents that flow through the discharge transistors cause the discharge of the bit line stray capacitances $C_{BL1}$-$C_{BLn}$ and thereby drive the bit lines to the de-selection voltage Vdes. Subsequently, before selecting the desired word line WL1-WLm, the discharge enable signal DIS_EN is de-asserted and the discharge circuits $325_{1-n}$ turned off. Similarly, the selected row and column lines may be respectively pre-charged to an appropriate safe starting voltage for selection and read or write operation. The control circuit 332 includes decode and timing logic and dictates access to memory cells MC within the array, including, as will be described in greater detail in the discussion related to FIG. 5, access to test cells.

Figure 4:
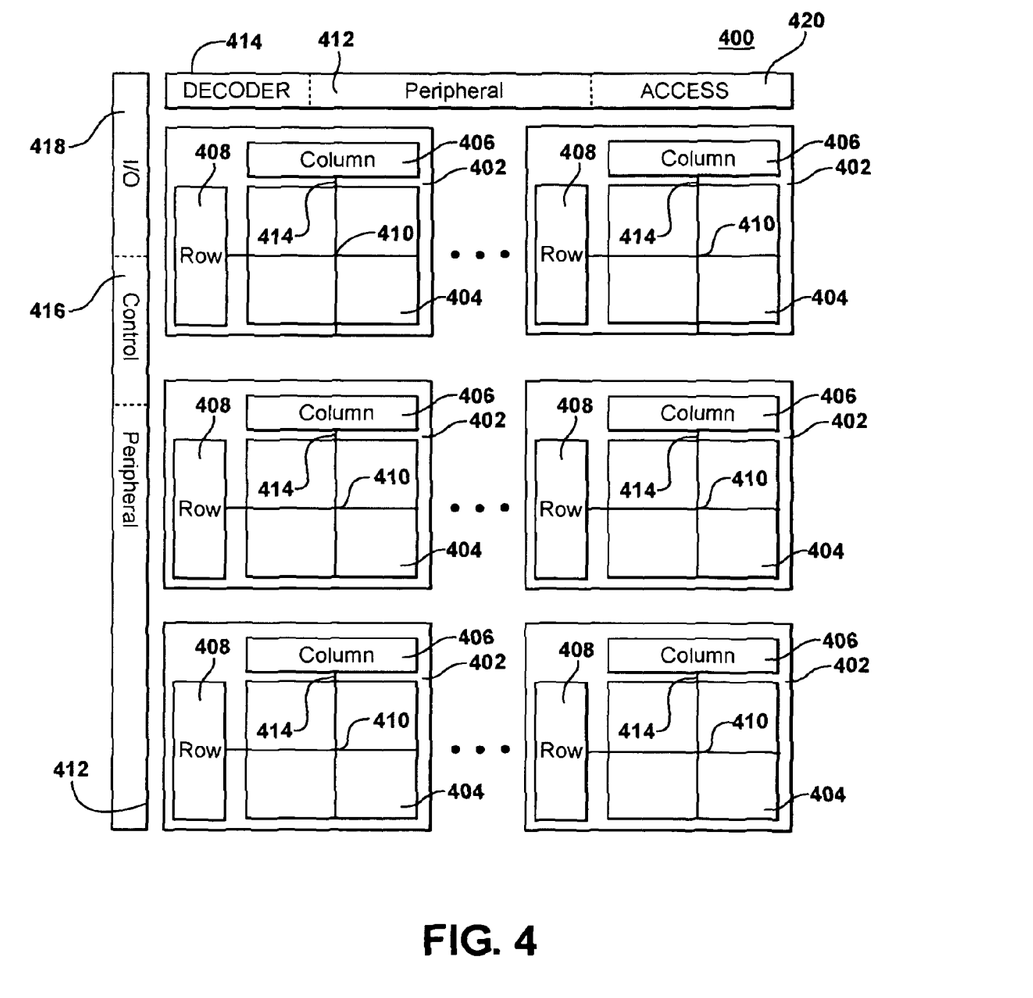
FIG. 4 is a block diagram of a rewritable nonvolatile memory array which that includes test cells, illustrating an embodiment in which memory cells are arranged in blocks, or tiles.

The conceptual block diagram of FIG. 4 provides a functional level view of an illustrative memory circuit 400 in accordance with the principles of the present invention which includes at least one test cell, such as the test cell 102 described in the discussion related to FIG. 1. In this illustrative embodiment, the memory circuit 400 includes at least one array of rewriteable nonvolatile memory cells arranged as a storage matrix tile 402, along with peripheral circuitry that, in combination, yields the rewritable nonvolatile memory circuit 400. The rewritable nonvolatile memory cells of the storage matrix 404 may be implemented as, for example, phase change memory cells. In this illustrative embodiment, the memory circuit 400 includes row drivers 408 and column drivers 406 configured to access cells within the storage matrix 404.

Accesses carried out by the row 408 and column 406 drivers include reading from the memory cells of the matrix 404 and writing to the memory cells of the matrix 404. Peripheral circuitry 412 includes decoding circuitry 414 which accepts address signals, typically transmitted from another electronic device except in some embedded applications, and decodes the address signals to determine which of the row 408 and column 406 drivers to activate and, thereby, which of the memory cells within the array 404 to access. The access circuitry 420 includes sources for row 408 and column 406 drivers. In illustrative embodiments the sources for row 408 and column 406 drivers may be situated on the same integrated circuit as the array 404, or an interface for the off-chip sources may be included within the access circuitry 420. The microprocessor controller may also be located on chip for "one-chip" system.

Peripheral circuitry 412 may include control circuitry 416 which accepts READ, WRITE, and CLOCK signals and develops control signals for the rewritable nonvolatile memory 400. The control signals developed for the memory 400 may include data direction control (e.g., "read from" or "write to" the storage matrix tile 402) and multi-phase clock signals, for example. As will be described in greater detail in the discussion related to FIG. 5, test access circuitry, including sense circuitry, may share some components of storage-cell access circuitry.

Figure 5:
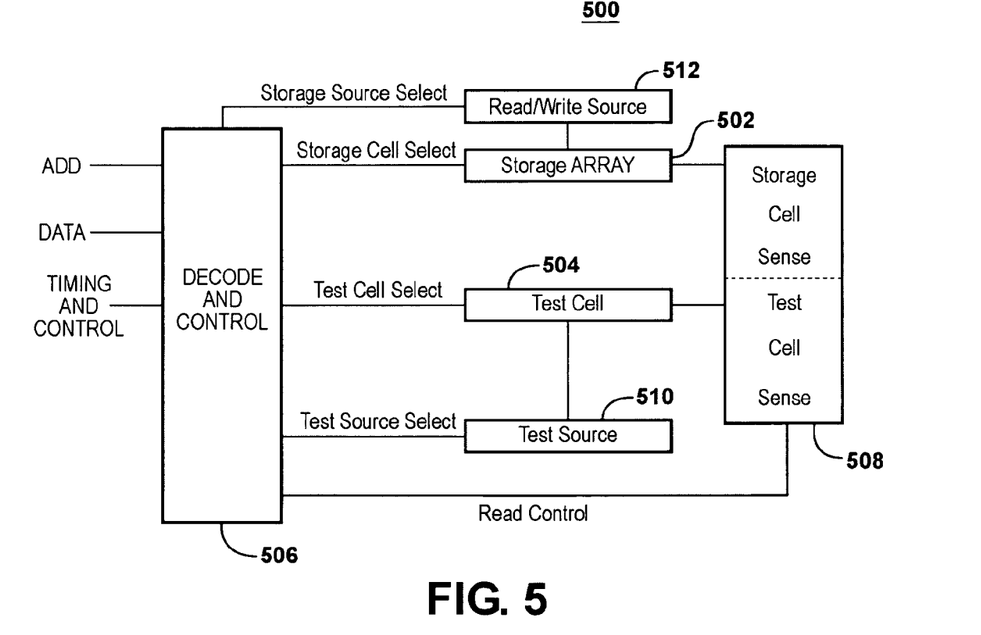
FIG. 5 is a block diagram of a rewritable nonvolatile memory array which illustrates control and access circuitry such as may be employed to access test cells in accordance with the principles of the present invention.

The block diagram of FIG. 5 provides a more detailed view of selection and control circuitry related to test cells such as may be employed by a rewritable nonvolatile memory in accordance with the principles of the present invention. The memory 500 includes a storage cell array 502 which may be implemented, as previously described, as tiles, or blocks, of phase change memory cells, for example. As previously described, one or more test cells 504 may be positioned proximate to storage cells within the array 502 in order to provide an accurate representation of the physical and electrical characteristics of nearby storage cells. Decode and control circuitry 506 accepts signals that may include: data, address, timing, and control signals. The decode and control circuitry 506 produces signals that may include: storage source selection, storage cell selection, test cell selection, test source selection, and read control, for example. Data signals may be organized serially or in parallel. Additionally, there may be a one-to-one correspondence between a storage cell and a bit of data or, in a multi-level cell implementation, each cell may contain information corresponding to a plurality of bits and, accordingly, to a plurality of data signals.

The decode and control circuitry 506 may employ the data, address, timing, and control signals to develop control signals that reflect the presence of test cells within the memory integrated circuit. For example, decode and control circuitry 506 may include test-specific circuitry, such as built in self test circuitry. The built in self test circuitry may include microcode, micro-sequencer, and one or more test registers to store results for reading later. The test register may be configured as a base test address and data stored in the test register may indicate which of a plurality of test cells is to be addressed, along with which test operation is to be performed, such as endurance or data retention testing, for example. Test results may be analyzed internally by built in self test circuitry. Alternatively, external circuitry, such as manufacturing test equipment may analyze test results at various stages, including at a stage where the external test circuitry reads raw or processed data from sensing circuitry 508.

The sensing circuitry 508 may include separate storage-cell sensing and test-cell sensing circuits, or storage and test circuits may share sensing circuitry. Additionally, sensing of test cells may be performed primarily off-chip, with on-chip test sensing circuitry limited to buffering and conditioning circuitry, for example. Read control signal(s) developed by the decode and control circuitry 506 dictate the operation of the sensing circuitry 508 in this illustrative embodiment. Such control may entail, for example, selecting sense circuitry dedicated to either storage cells or test cells and may control sensing parameters, such as duration, for example.

Test source selection signal(s) developed by the decode and control circuit 506 may be used to select among a plurality of test sources 510. The various test sources may, for example, provide pulses of different durations, shapes and/or amplitude, each tailored to a different type of test. Such sources may be located on- or off-chip. In illustrative embodiments, sources from a plurality of read/write sources 512 may serve double-duty, as both test and read/write sources. Storage cell select signal(s) developed by the decode and control circuitry 506 select one or more addressed cells within the storage cell array 502 by, for example, asserting one or more row and column lines, as described in greater detail in the description related to FIG. 3. Storage source select signal(s) developed by the decode and control circuitry 506 select an appropriate source from the read/write source block 512: a write0 source for a RESET operation, for example.

To assist tracking use and conditions applied to the memory in the field, a test bit may be written to a reset state.

The bit may be checked periodically to see if excessive temperature was applied to the chip which has set the bit. In such case, the rest of the data on the chip is suspect. To better assure integrity, 3 test bits may be reset and the 3 bits read on a majority voting basis to better assure confidence in the result. Such bits may be accessed directly or through use of an "electronic key" command to the chip which then places those bits on the I/O port for reading or writing.

As previously described, a memory in accordance with the principles of the present invention may employ off-chip resources to assist in accurately writing to and reading from test cells included within an integrated circuit memory, especially in the context of operating a test cell 102. In an illustrative embodiment a memory in accordance with the principles of the present invention the cell sense circuit block 508 includes an interface that sends memory-array signals off-chip for analysis after buffering and conditioning the signal. Such signals may be row and column signals taken directly from row and column lines associated with test cells and, as such, may provide direct or decoded access to a selected test cell 102 for evaluation. Such direct access to test cell nodes may be particularly advantageous during manufacturing test, for example. Additionally, higher-amplitude signals, signals that may not otherwise normally be available on-chip, maybe brought on-chip for accelerated testing, such as accelerated endurance testing, for example.

The electronic device(s) described in the discussion related to the previous figures may be employed to particular advantage in a wide variety of systems. The schematic diagram of FIG. 6 will be discussed to illustrate the devices' use in a few such systems. The schematic diagram of FIG. 6 includes many components and devices, some of which may be used for specific embodiments of a system in accordance with the principles of the present invention and others not used. In other embodiments, other similar systems, components and devices may be employed. In general, the system includes logic circuitry configured to operate along with rewritable nonvolatile memory devices in accordance with the principles of the present invention. The logic circuitry may be discrete, programmable, application-specific, or in the form of a microprocessor, microcontroller, or digital signal processor, for example. The embodiments herein may be employed on integrated chips or connected to such circuitry. The exemplary system of FIG. 6 is for descriptive purposes only.

Figure 6:
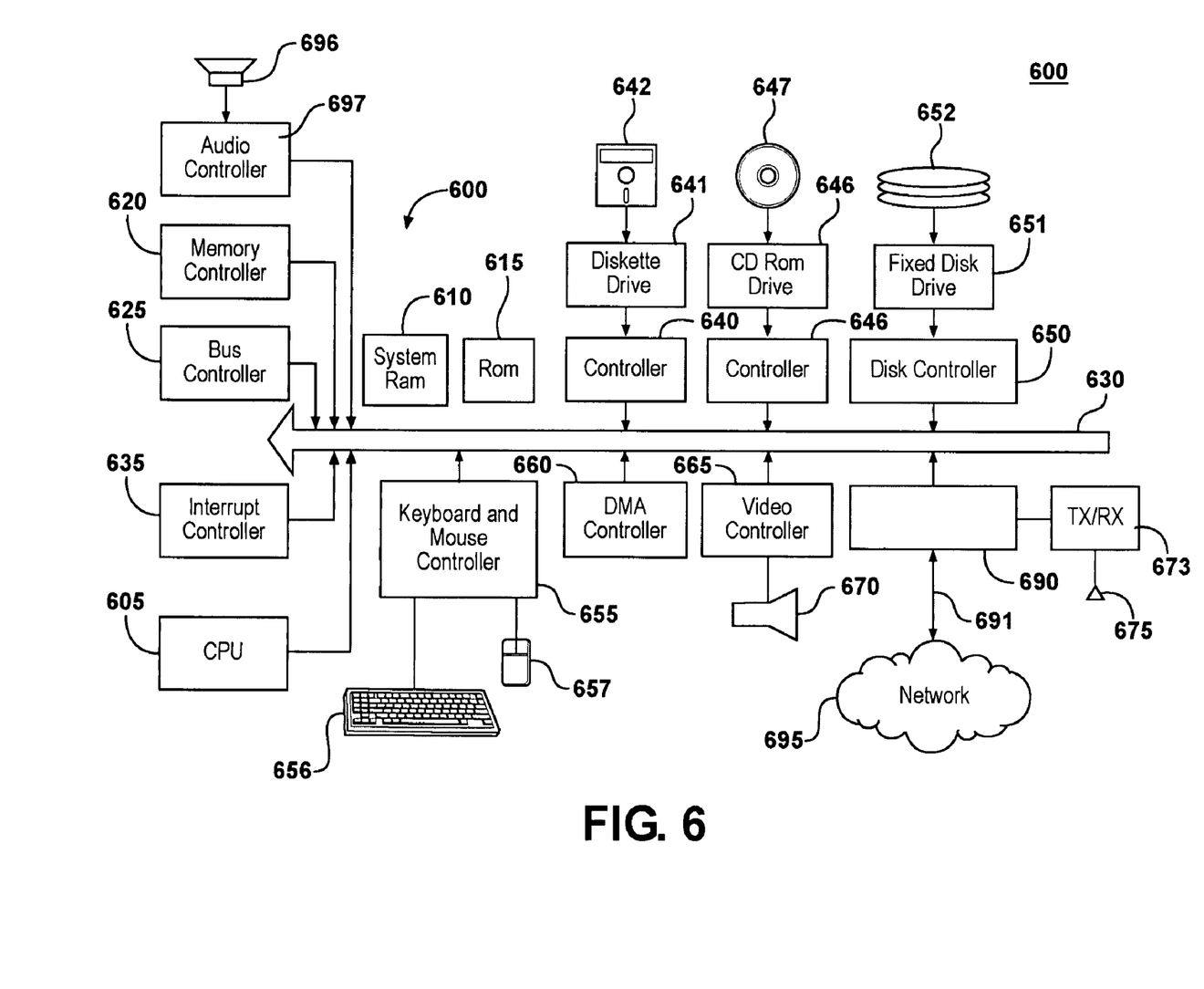
FIG. 6 is a block diagram of an electronic system that employs a memory in accordance with the principles of the present invention.

Although the description may refer to terms commonly used in describing particular computer, communications, tracking, and entertainment systems; the description and concepts equally apply to other systems, including systems having architectures dissimilar to that illustrated in FIG. 6. The electronic system 600, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, a digital signal processor, or a radio frequency identification device. Any or all of the components depicted in FIG. 6 may employ rewritable nonvolatile memory devices in accordance with the principles of the present invention, for example.

In an illustrative embodiment, the system 600 may include a central processing unit (CPU) 605, which may include a microprocessor, a random access memory (RAM) 610 for temporary storage of information, and a read only memory (ROM) 615 for permanent storage of information. A memory controller 620 is provided for controlling RAM 610. In accordance with the principles of the present invention, all of, or any portion of, any of the memory elements (e.g. RAM or ROM) may be implemented with rewritable nonvolatile memory devices in accordance with the principles of the present invention.

An electronic system 600 in accordance with the principles of the present invention may be a microprocessor that operates as a CPU 605, in combination with embedded rewritable nonvolatile memory that operates as RAM 610 and/or ROM 615, or as a portion thereof. In this illustrative example, the microprocessor/rewritable nonvolatile memory device combination may be standalone, or may operate with other components, such as those of FIG. 6 yet-to-be described.

In implementations within the scope of the invention, a bus 630 interconnects the components of the system 600. A bus controller 625 is provided for controlling bus 630. An interrupt controller 635 may or may not be used for receiving and processing various interrupt signals from the system components. Such components as the bus 630, bus controller 625, and interrupt controller 635 may be employed in a large-scale implementation of a system in accordance with the principles of the present invention, such as that of a standalone computer, a router, a portable computer, or a data storage system, for example.

Mass storage may be provided by diskette 642, CD ROM 647, or hard drive 652. Data and software may be exchanged with the system 600 via removable media such as diskette 642 and CD ROM 647. Diskette 642 is insertable into diskette drive 641 which is, in turn, connected to bus 630 by a controller 640. Similarly, CD ROM 647 is insertable into CD ROM drive 646 which is, in turn, connected to bus 630 by controller 645. Hard disc 652 is part of a fixed disc drive 651 which is connected to bus 630 by controller 650. Although conventional terms for storage devices (e.g., diskette) are being employed in this description of a system in accordance with the principles of the present invention, any or all of the storage devices may be implemented using rewritable nonvolatile memory devices in accordance with the principles of the present invention. Removable storage may be provided by a nonvolatile storage component, such as a thumb drive, that employs rewritable nonvolatile memory devices in accordance with the principles of the present invention as the storage medium. Storage systems that employ rewritable nonvolatile memory devices as "plug and play" substitutes for conventional removable memory, such as disks or CD ROMs or thumb drives, for example, may emulate existing controllers to provide a transparent interface for controllers such as controllers 640, 645, and 650, for example.

User input to the system 600 may be provided by any of a number of devices. For example, a keyboard 656 and mouse 657 are connected to bus 630 by controller 655. An audio transducer 696, which may act as both a microphone and/or a speaker, is connected to bus 630 by audio controller 697, as illustrated. Other input devices, such as a pen and/or tabloid may be connected to bus 630 and an appropriate controller and software, as required, for use as input devices. DMA controller 660 is provided for performing direct memory access to RAM 610, which, as previously described, may be implemented in whole or part using rewritable nonvolatile memory devices in accordance with the principles of the present invention. A visual display is generated by video controller 665 which controls display 670. The display 670 may be of any size or technology appropriate for a given application.

In a cellular telephone or portable entertainment system embodiment, for example, the display 670 may include one or more relatively small (e.g. on the order of a few inches per side) LCD displays. In a large-scale data storage system, the display may be implemented as large-scale multi-screen, liquid crystal displays (LCDs), or organic light emitting diodes (OLEDs), including quantum dot OLEDs, for example.

The system 600 may also include a communications adaptor 690 which allows the system to be interconnected to a local area network (LAN) or a wide area network (WAN), schematically illustrated by bus 691 and network 695. An input interface 699 (not shown) operates in conjunction with an input device 693 (not shown) to permit a user to send information, whether command and control, data, or other types of information, to the system 600. The input device and interface may be any of a number of common interface devices, such as a joystick, a touch-pad, a touch-screen, a speech-recognition device, or other known input device. In some embodiments of a system in accordance with the principles of the present invention, the adapter 690 may operate with transceiver 673 and antenna 675 to provide wireless communications, for example, in cellular telephone, RFID, and wifi computer implementations.

Operation of system 600 is generally controlled and coordinated by operating system software. The operating system controls allocation of system resources and performs tasks such as processing scheduling, memory management, networking, and I/O services, among other things. In particular, an operating system resident in system memory and running on CPU 605 coordinates the operation of the other elements of the system 600.

In illustrative handheld electronic device embodiments of a system 600 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 655, keyboard 656 and mouse 657, for example. Embodiments with a transmitter, recording capability, etc., may also include a microphone input (not shown).

In an illustrative RFID transponder implementation of a system 600 in accordance with the principles of the present invention, the antenna 675 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 673. where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into a rewritable nonvolatile memory device in accordance with the principles of the present invention. In this illustrative embodiment, data read out from the memory is transferred to the transceiver 673 as an "answerback" signal on the antenna 675 at a second carrier frequency $F_2$. In passive RFID systems, power is derived from the interrogating signal and memory such as provided by a rewritable nonvolatile memory device in accordance with the principles of the present invention is particularly well suited to such use.

I claim:

1. A circuit, comprising:
an integrated circuit including an array of rewritable nonvolatile memory cells and a test cell separate from the nonvolatile memory cells;
test source circuitry spaced apart from the integrated circuit, the integrated circuit including an interface for transmitting signals between the test source circuitry and the test cell;
nonvolatile memory source circuitry, the nonvolatile memory source circuitry being distinct from the test source circuitry and being on the same chip as the nonvolatile memory cells.

2. The circuit of claim 1, wherein the test cell is of the same structure and composition as the memory cells.

3. The circuit of claim 2, further comprising a plurality of test cells distributed among the memory cells.

4. The circuit of claim 1, wherein the memory cells are phase-change memory cells.

5. The circuit of claim 1, wherein the test cell is configured to test the retention of the memory cells.

6. The circuit of claim 1, wherein the memory cells are resistive random access memory (RRAM) cells.

7. The circuit of claim 1, wherein the test source circuitry includes an interface configured to accept a test source signal from an external device.

8. The circuit of claim 1, further comprising test circuitry configured to store test results and to provide access to the test results.

9. The circuit of claim 1, wherein the test cell is configured to test the endurance of the memory cells.

10. The circuit of claim 4, wherein the test cell is configured to test the reset current ($I_{RESET}$) of the memory cells.

11. The circuit of claim 4, wherein the test cell is configured to test the virgin resistance ($R_{virgin}$) of the memory cells.

12. The circuit of claim 4, wherein the test cell is configured to test the SET time of the memory cells.

13. The circuit of claim 1 further comprising:
controller circuitry configured to access the array of nonvolatile memory cells.

14. The circuit of claim 13, further comprising a transceiver.

15. The circuit of claim 14, wherein the circuit is configured as a radio frequency identification device (RFID).

16. The circuit of claim 14, wherein the circuit is configured as a cellular telephone.

17. The circuit of claim 1, wherein the peak current available from the test source circuitry is greater than the peak current available from the nonvolatile memory source circuitry.

18. The circuit of claim 1, wherein the test cell is positioned adjacent to one of the rewritable nonvolatile memory cells.

19. The circuit of claim 1, wherein the test cell is positioned between two of the rewritable nonvolatile memory cells.

20. The circuit of claim 1, wherein the array is organized as a plurality of blocks, each of the blocks including a plurality of the rewritable nonvolatile memory cells and the test cell is positioned between two of the blocks.

21. The circuit of claim 1, further comprising a selection line electrically coupled to the test cell, the selection line not being electrically coupled to a memory cell.

* * * * *